(12) United States Patent
Chang et al.

(10) Patent No.: US 6,955,467 B2
(45) Date of Patent: Oct. 18, 2005

(54) SEISMIC ISOLATION BEARING ASSEMBLY WITH A FRAME UNIT FOR SUPPORTING A MACHINE BODY THEREON

(75) Inventors: Kuo-Chun Chang, Taipei (TW); Jenn-Shin Hwang, Taipei (TW); George C. Lee, Amherst, NY (US); Sen-Nan Lee, Yung-Ho (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 10/821,373

(22) Filed: Apr. 9, 2004

(65) Prior Publication Data

US 2005/0100253 A1 May 12, 2005

(30) Foreign Application Priority Data

Nov. 6, 2003 (TW) ........................................ 92131098 A (51) Int. Cl.[7] .............................................. F16C 21/00
(52) U.S. Cl. .............................. 384/25; 384/36; 384/50; 384/618
(58) Field of Search ............................... 384/36, 25, 50, 384/618

(56) References Cited

U.S. PATENT DOCUMENTS 5,071,261 A * 12/1991 Stuve .......................... 384/36
2004/0131287 A1 * 7/2004 Lee et al. ..................... 384/36

* cited by examiner

Primary Examiner—Lenard A. Footland
(74) Attorney, Agent, or Firm—Ladas & Parry LLP (57) ABSTRACT

A seismic isolation bearing assembly includes a frame unit including upper and lower frames and defining a plurality of upper and lower sub-frames, and a plurality of bearing units, each of which is mounted in a mounting cell defined by a respective one of the upper sub-frames and a respective one of the lower sub-frames, and each of which includes spaced apart upper and lower load plates and a bearing interposed between and in sliding contact with the upper and lower load plates. The upper load plate is secured to the respective one of the upper sub-frames. The lower load plate is secured to the respective one of the lower sub-frames.

9 Claims, 9 Drawing Sheets

SEISMIC ISOLATION BEARING ASSEMBLY WITH A FRAME UNIT FOR SUPPORTING A MACHINE BODY THEREON

CROSS-REFERENCE TO RELATED APPLICATION

This application claims priority of Taiwanese application No. 092131098, filed on Nov. 6, 2003.

BACKGROUND OF THE INVENTION

1. Field of the Invention

This invention relates to a seismic isolation bearing assembly, more particularly to a seismic isolation bearing assembly with a plurality of bearing units and a frame unit that couples the bearing units together for supporting a machine body thereon.

2. Description of the Related Art

Figure 1:
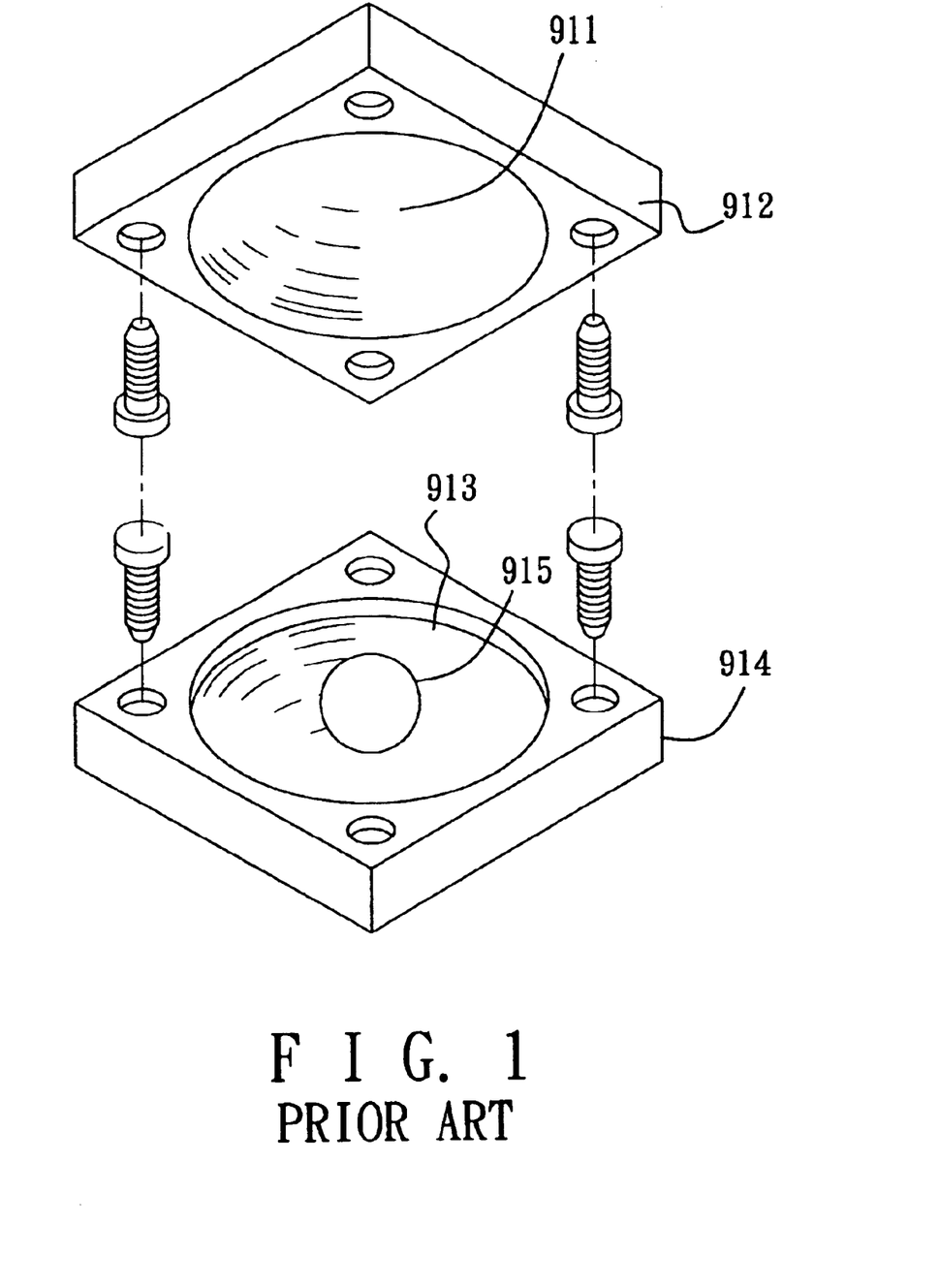
FIG. 1 is a perspective view showing a conventional seismic isolation bearing assembly.
Figure 2:
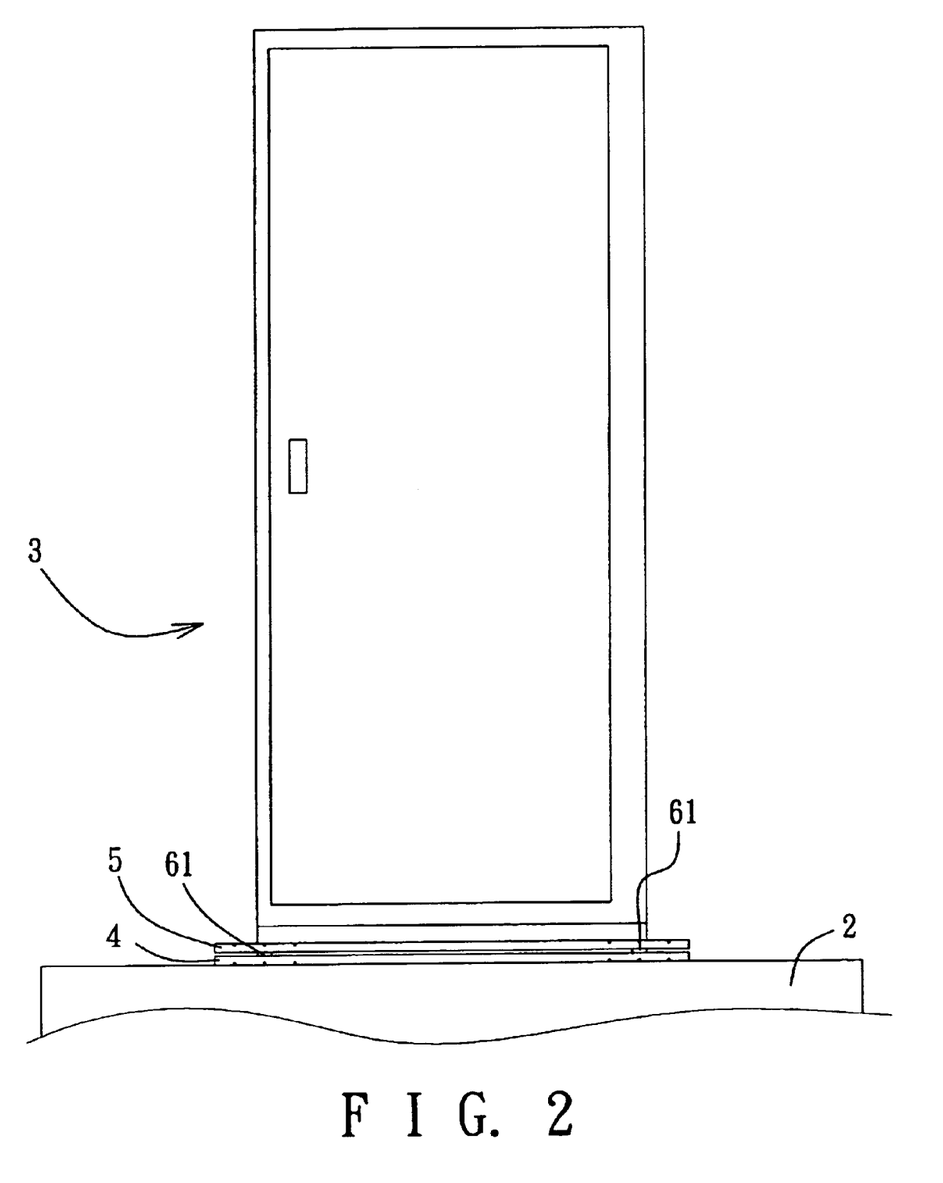
FIG. 2 is a schematic side view of the first preferred embodiment of a seismic isolation bearing assembly according to the present invention for supporting a machine body on a foundation.
Figure 3:
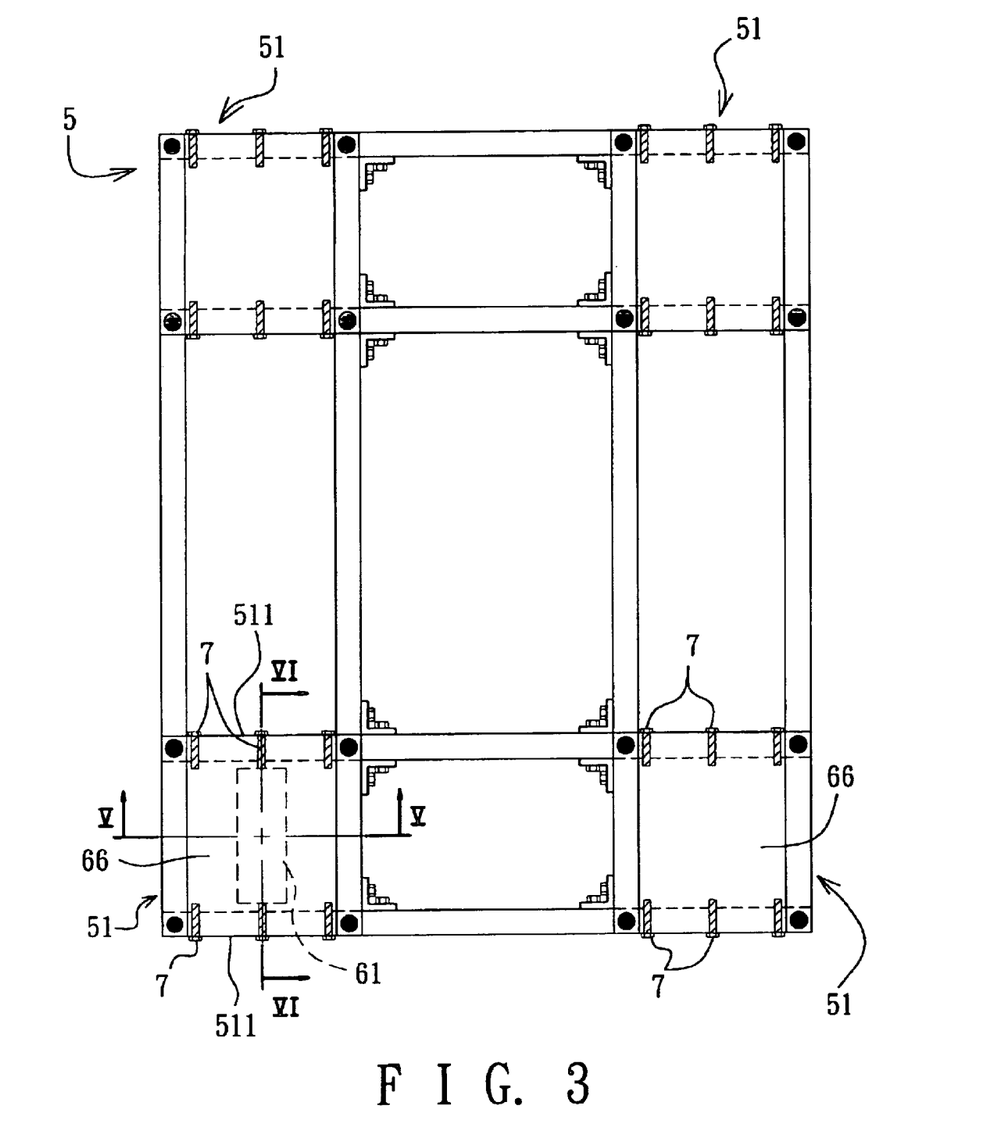
FIG. 3 is a top view of the first embodiment.
Figure 4:
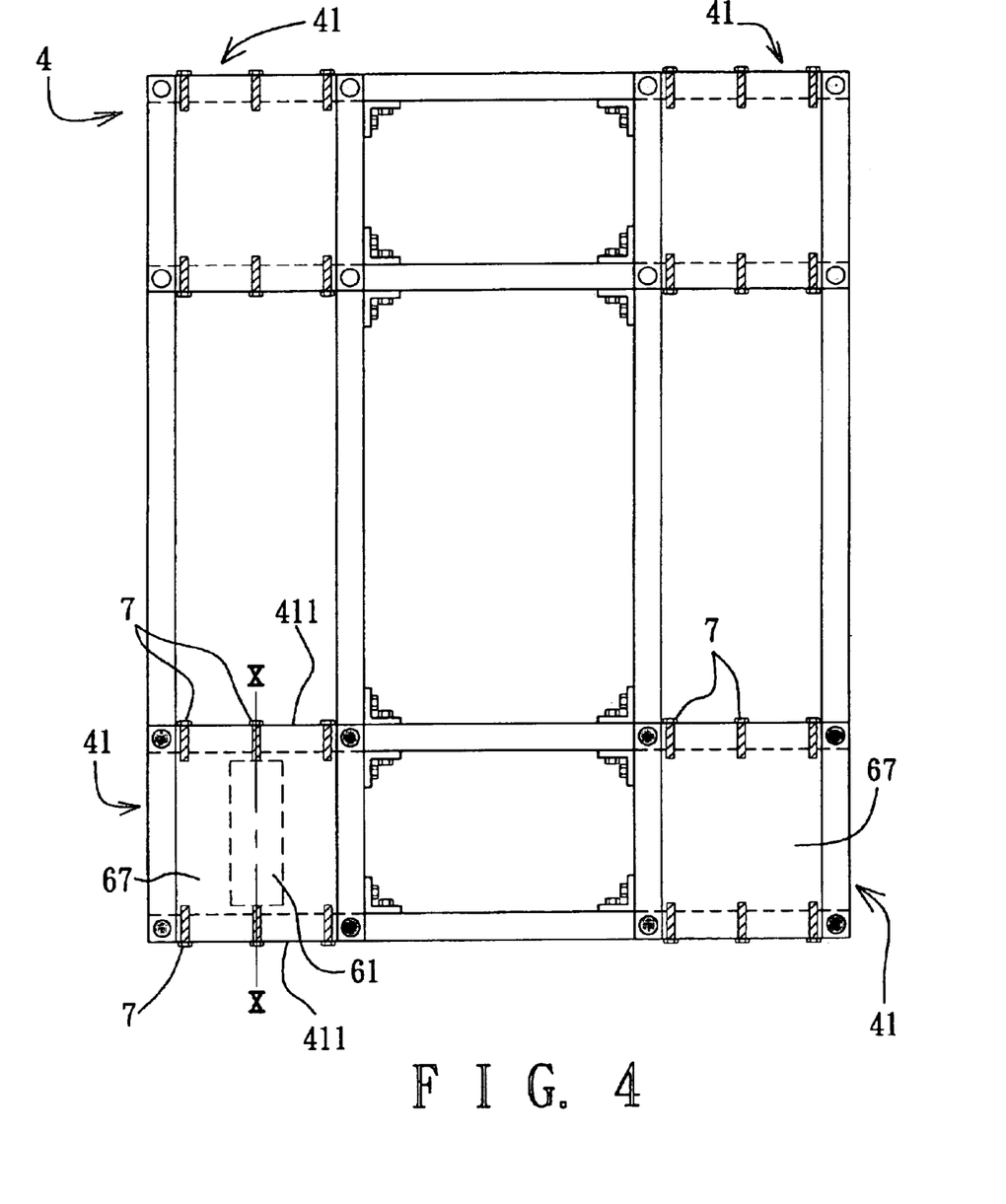
FIG. 4 is a bottom view of the first embodiment.
Figure 5:
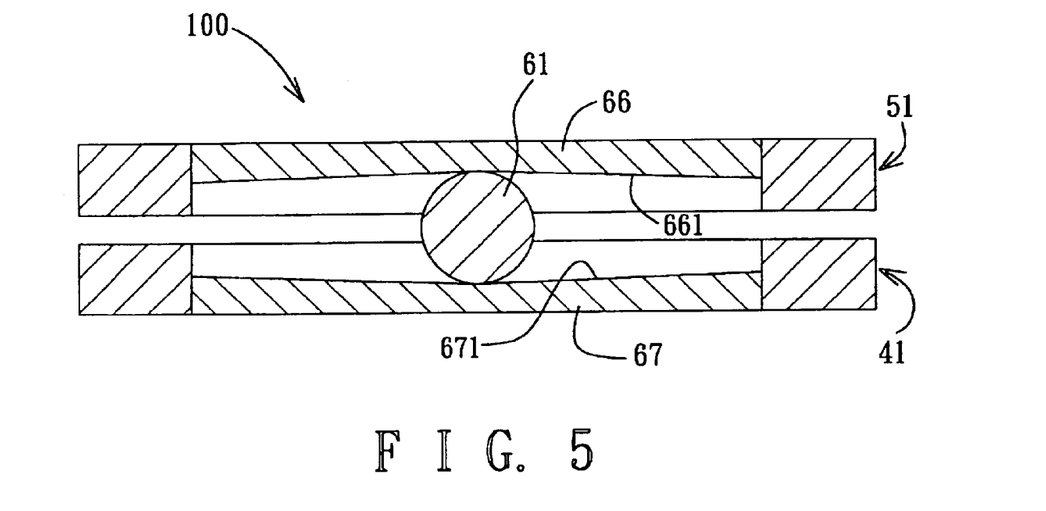
FIG. 5 is a sectional view taken along lines V—V in FIG. 3.
Figure 6:
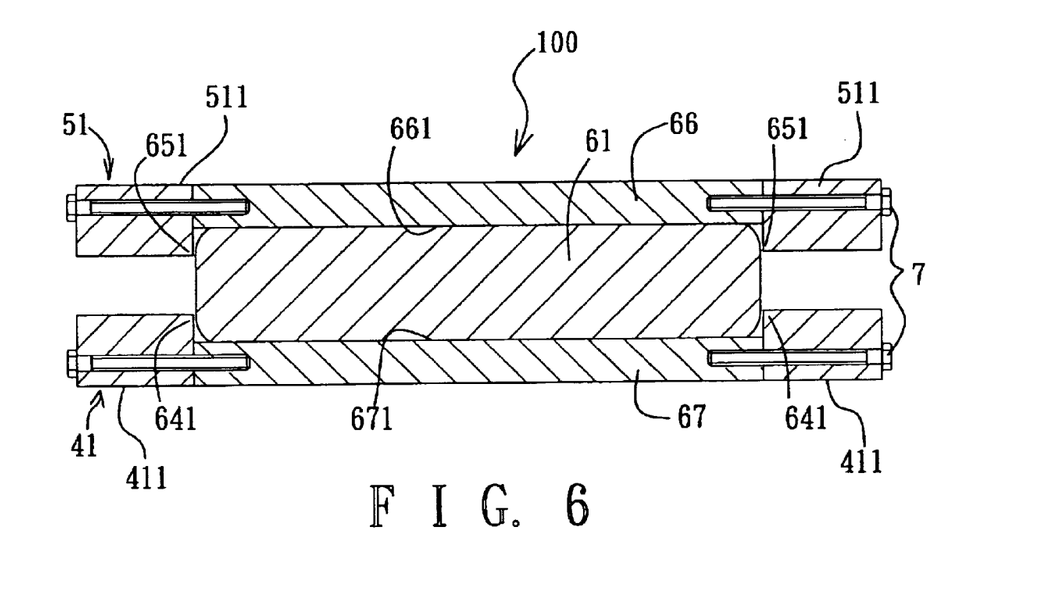
FIG. 6 is a sectional view taken along lines VI—VI in FIG. 3.
Figure 7:
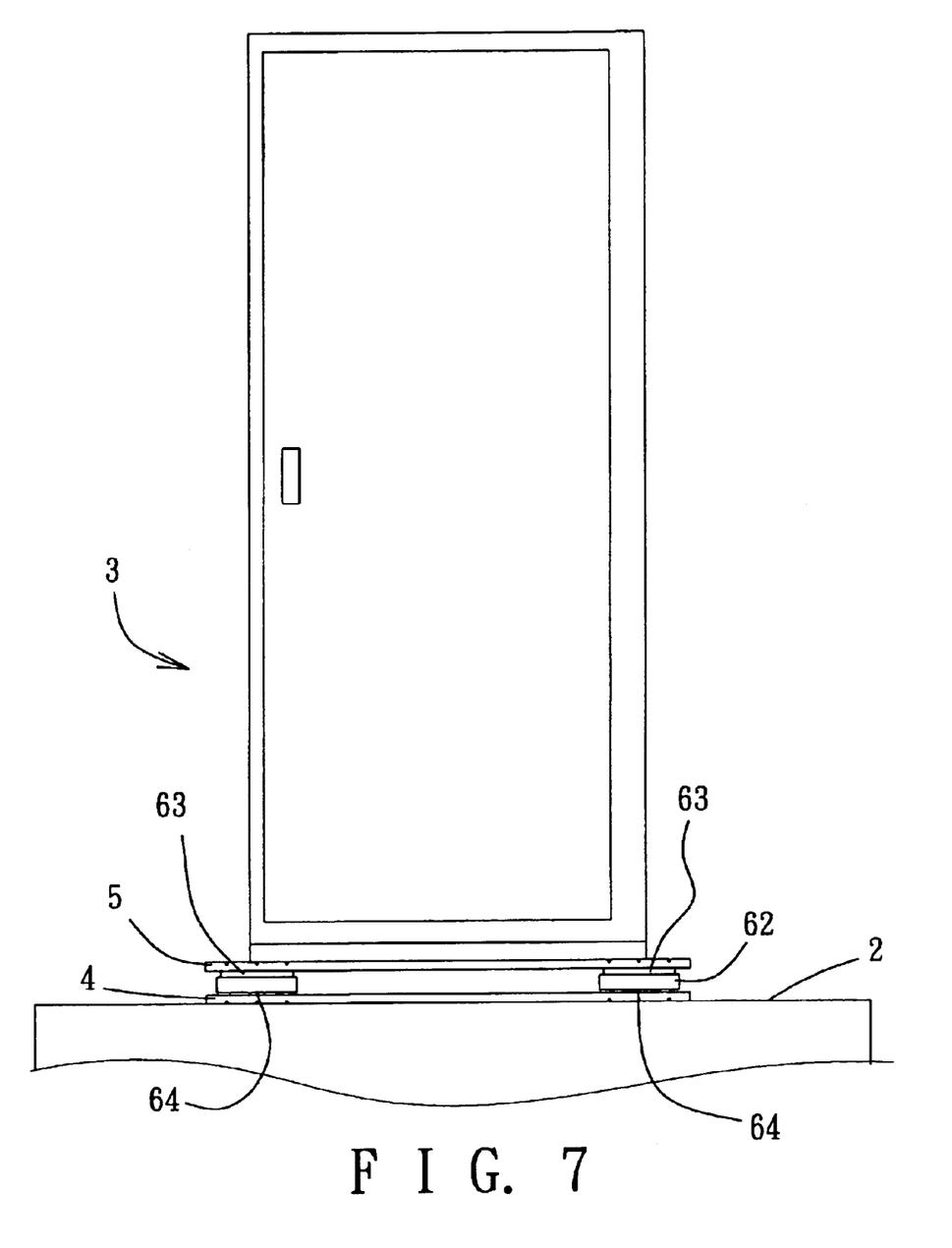
FIG. 7 is a schematic side view of the second preferred embodiment of the seismic isolation bearing assembly according to the present invention.
Figure 8:
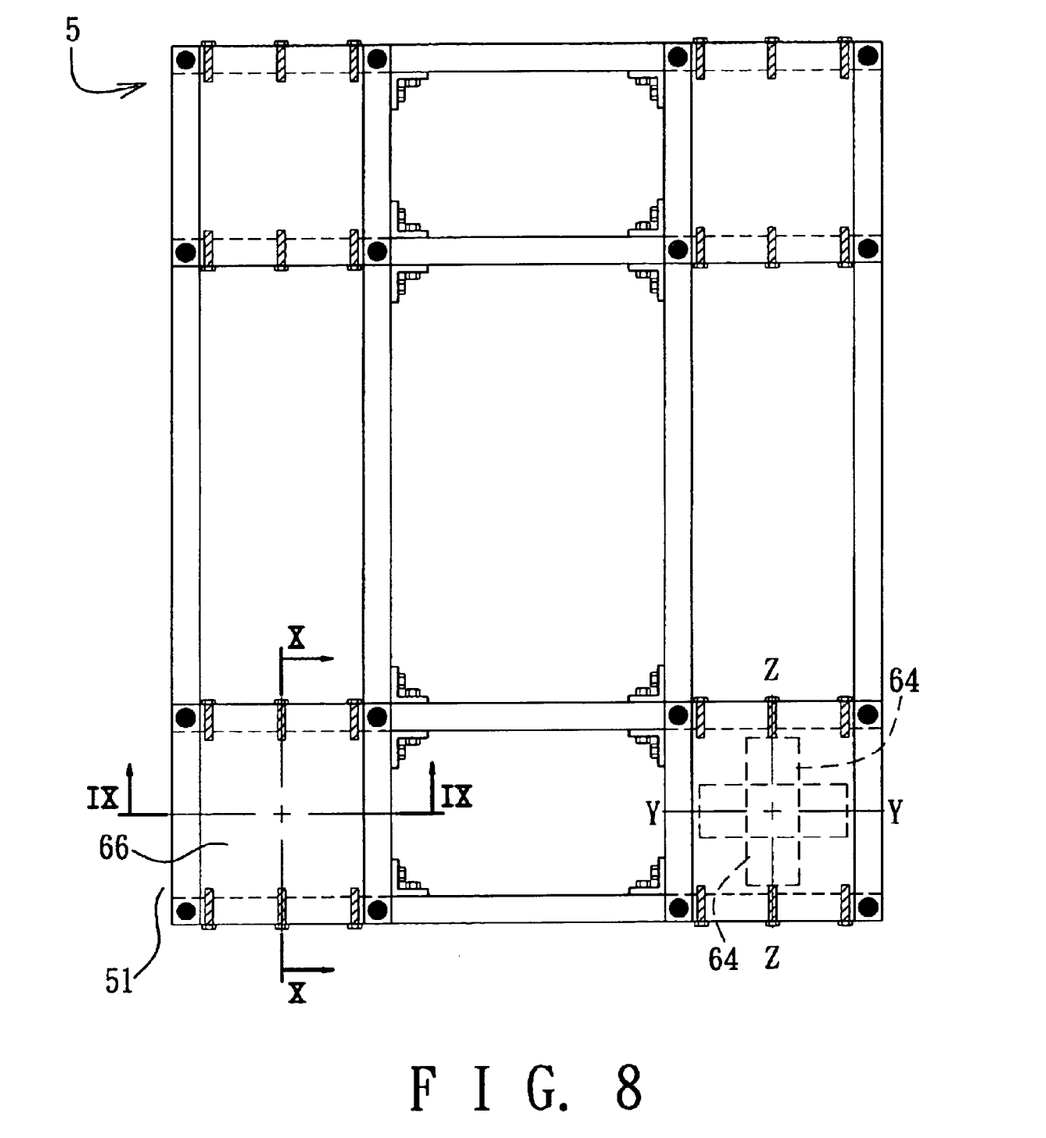
FIG. 8 is a top view of the second embodiment.
Figure 9:
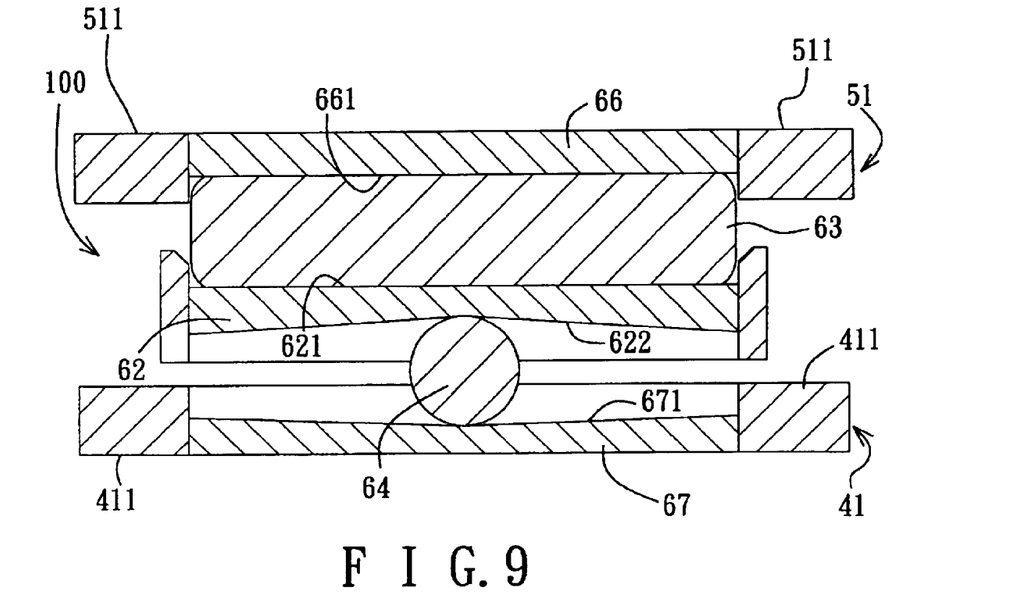
FIG. 9 is a sectional view taken along lines IX—IX in FIG. 8.
Figure 10:
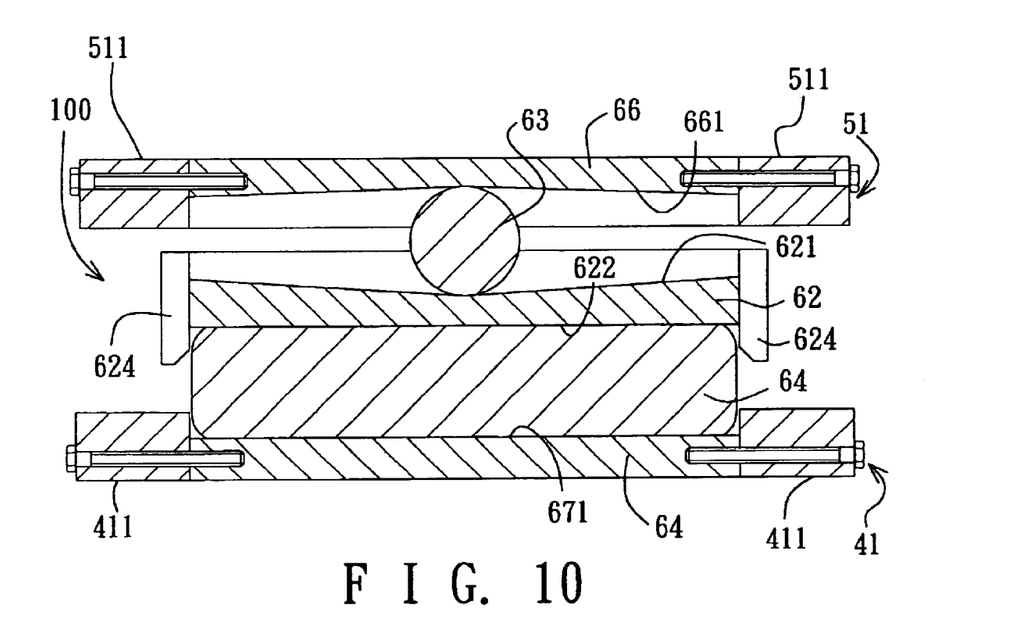
FIG. 10 a sectional view taken along lines X—X in FIG. 8.

FIG. 1 illustrates a conventional seismic isolation bearing assembly that is disclosed in U.S. Pat. No. 5,599,106 and that includes upper and lower load plates 912, 914 formed respectively with conical recessed surfaces 911, 913, and a ball 915 interposed between and in sliding contact with the recessed surfaces 911, 913 of the upper and lower load plates 912, 914. Since the conventional seismic isolation bearing assembly is designed for supporting a structure, such as a building or a bridge, it is not suitable for supporting a machine body, such as a semiconductor optical aligner, a high precision analyzer, a large size computer server, or a main frame, that requires a high precision or a stable working site during processing. In addition, the machine body, which is relatively large in size and heavy, is difficult to be installed on the conventional seismic isolation bearing assembly.

SUMMARY OF THE INVENTION

Therefore, the object of the present invention is to provide a seismic isolation bearing assembly with a frame unit so as to overcome the aforesaid drawbacks of the prior art.

According to the present invention, there is provided a seismic isolation bearing assembly that includes: a frame unit including upper and lower frames that are spaced apart from each other, the upper frame being adapted to be secured to a machine body and defining a plurality of upper sub-frames, the lower frame being adapted to be secured to a foundation, on which the machine body is to be supported, and defining a plurality of lower sub-frames, each of which is aligned and cooperates with a respective one of the upper sub-frames to define a mounting cell therebetween; and a plurality of bearing units, each of which is mounted in the mounting cell defined by a respective one of the upper sub-frames and a respective one of the lower sub-frames, and each of which includes spaced apart upper and lower load plates and a bearing interposed between and in sliding contact with the upper and lower load plates. The upper load plate is secured to the respective one of the upper sub-frames. The lower load plate is secured to the respective one of the lower sub-frames.

BRIEF DESCRIPTION OF THE DRAWINGS

In drawings which illustrate embodiments of the invention.

DETAILED DESCRIPTION OF THE PREFERRED EMBODIMENTS

For the sake of brevity, like elements are denoted by the same reference numerals throughout the disclosure.

FIGS. 2 to 6 illustrate the first preferred embodiment of a seismic isolation bearing assembly according to the present invention for supporting a machine body 3 on a foundation 2. The seismic isolation bearing assembly includes: a frame unit including upper and lower frames 5, 4 that are spaced apart from each other, the upper frame 5 being adapted to be secured to the machine body 3 and defining a plurality of upper sub-frames 51, the lower frame 4 being adapted to be secured to the foundation 2 and defining a plurality of lower sub-frames 41, each of which is aligned and cooperates with a respective one of the upper sub-frames 51 to define a mounting cell 100 therebetween; and a plurality of bearing units 6, each of which is mounted in the mounting cell 100 defined by a respective one of the upper sub-frames 51 and a respective one of the lower sub-frames 41, and each of which includes spaced apart upper and lower load plates 66, 67 and a bearing 61, which is in the form of a cylindrical rod in this embodiment, interposed between and in sliding contact with the upper and lower load plates 66, 67. The upper load plate 66 is secured to the respective one of the upper sub-frames 51 through screw means 7. The lower load plate 67 is secured to the respective one of the lower sub-frames 41 through the screw means 7. The cylindrical rods of the bearing units 6 are disposed at the same level, and are parallel to each other.

In this embodiment, the upper load plate 66 has an upper contact surface 661 that faces toward the lower load plate 67. The lower load plate 67 has a curved lower contact surface 671 that confronts the upper contact surface 661 of the upper load plate 66. The bearing 61 is disposed between and is in sliding contact with the upper contact surface 661 of the upper load plate 66 and the lower contact surface 671 of the lower load plate 67. The lower contact surface 671 of the lower load plate 67 has two opposite ends that are opposite to each other in a transverse direction relative to the cylindrical rod 61 of the respective one of the bearing units 6, and extends curvedly in the transverse direction to define a rest line (X) of a lowest level, which extends in an axial direction relative to the cylindrical rod (see FIG. 4), in a middle position between the opposite ends of the lower contact surface 671 so as to permit resting of the cylindrical rod of the bearing 61 on the lower contact surface 671 of the lower load plate 67 along the rest line (X) by virtue of gravity.

Preferably, the upper contact surface 661 of the upper load plate 66 extends curvedly in the transverse direction, and has a shape that is inverse of that of the lower contact surface 671 of the lower load plate 67.

Each of the upper sub-frames 51 has two opposite side portions 511 that are opposite to each other in the axial direction. Each of the lower sub-frames 41 has two opposite side portions 411 that are aligned respectively with the opposite side portions 511 of the respective one of the upper sub-frames 51. Each of the opposite side portions 411 of each of the lower sub-frames 41 is spaced apart from the respective one of the opposite side portions 511 of the respective one of the upper sub-frames 51 by a distance that is less than the diameter of the cylindrical rod of the bearing 61 so as to limit movement of the cylindrical rod within the mounting cell 100.

FIGS. 7 to 10 illustrate the second preferred embodiment of the seismic isolation bearing assembly according to the present invention. The seismic isolation bearing assembly of this embodiment is similar to the previous embodiment, except that an intermediate load plate 62 is interposed between the upper and lower load plates 66, 67 of each bearing unit 6 and that each bearing unit 6 includes an upper bearing 63 disposed between and in sliding contact with the upper and intermediate load plates 66, 62, and a lower bearing 64 disposed between and in sliding contact with the lower and intermediate load plates 67, 62.

In this embodiment, the upper bearings 63 of the bearing units 6 are disposed at the same level and are parallel to each other. The lower bearings 64 of the bearing units 6 are disposed at the same level, are parallel to each other, and are transverse to the upper bearings 63.

The upper load plate 66 has an upper contact surface 661 that faces toward the intermediate load plate 62. The intermediate load plate 62 has a curved first intermediate contact surface 621 that confronts the upper contact surface 661 of the upper load plate 66. The upper bearing 63 is disposed between and is in sliding contact with the upper contact surface 661 of the upper load plate 66 and the first intermediate contact surface 621 of the intermediate load plate 62. The first intermediate contact surface 621 of the intermediate load plate 62 has two opposite ends that are opposite to each other in a first transverse direction relative to the cylindrical rod of the upper bearing 63, and extends curvedly in the first transverse direction to define an intermediate rest line (Y) of a lowest level (see FIG. 8) in a middle position between the opposite ends of the first intermediate contact surface 621 so as to permit resting of the cylindrical rod of the upper bearing 63 on the first intermediate contact surface 621 of the intermediate load plate 62 along the intermediate rest line (Y) by virtue of gravity.

The intermediate load plate 62 further has a second intermediate contact surface 622 that is opposite to the first intermediate contact surface 621. The lower load plate 67 has a curved lower contact surface 671 that faces toward the intermediate load plate 62. The lower bearing 64 is disposed between and is in sliding contact with the second intermediate contact surface 622 of the intermediate load plate 62 and the lower contact surface 671 of the lower load plate 67. The lower contact surface 671 of the lower load plate 67 has two opposite ends that are opposite to each other in a second transverse direction relative to the cylindrical rod of the lower bearing 64, and extends curvedly in the second transverse direction to define a lower rest line (Z) of a lowest level (see FIG. 8) in a middle position between the opposite ends of the lower contact surface 671 so as to permit resting of the cylindrical rod of the lower bearing 64 on the lower contact surface 671 of the lower load plate 67 along the lower rest line (Z) by virtue of gravity.

The upper contact surface 661 of the upper load plate 66 extends curvedly in the first transverse direction, and has a shape that is inverse of that of the first intermediate contact surface 621 of the intermediate load plate 62. The second intermediate contact surface 622 of the intermediate load plate 62 extends curvedly in the second transverse direction, and has a shape that is inverse of that of the lower contact surface 671 of the lower load plate 67.

Each of the upper sub-frames 51 has two opposite side portions 511 that are opposite to each other in a first axial direction relative to the cylindrical rod of the upper bearing 63. Each of the lower sub-frames 41 has two opposite side portions 411 that are opposite to each other in a second axial direction relative to the cylindrical rod of the lower bearing 64. The intermediate load plate 62 is formed with two opposite side walls 624, each of which is aligned with and is spaced apart from a respective one of the side portions 511 of the respective one of the upper sub-frames 51 by a distance that is less than the diameter of the cylindrical rod of the upper bearing 63 so as to limit movement of the cylindrical rod of the upper bearing 63 within the mounting cell 100, and each of which is aligned with and is spaced apart from a respective one of the side portions 411 of the respective one of the lower sub-frames 41 by a distance that is less than the diameter of the cylindrical rod of the lower bearing 64 so as to limit movement of the cylindrical rod of the lower bearing 64 within the mounting cell 100.

Figure 11:
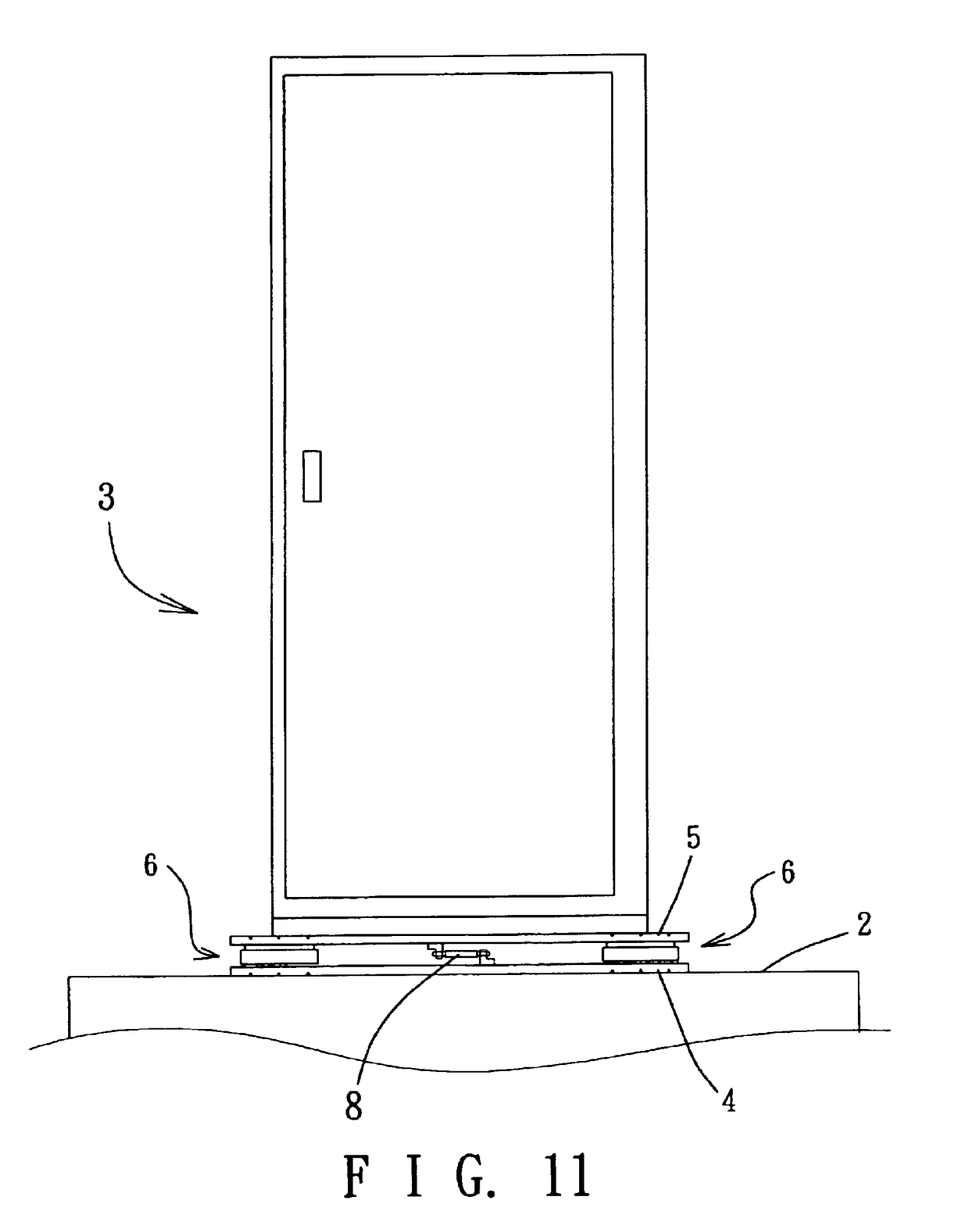
FIG. 11 is a schematic side view of the third preferred embodiment of the seismic isolation bearing assembly according to the present invention.

FIG. 11 illustrates the third preferred embodiment of the seismic isolation bearing assembly according to this invention. The seismic isolation bearing assembly of this embodiment differs from the second embodiment in that a plurality of resistance-providing members 8 are further included in the seismic isolation bearing assembly. Each of the resistance-providing members 8 is disposed between an adjacent pair of the mounting cells 100, and is associated with the upper and lower frames 5, 4 so as to provide a friction force therebetween and to thereby prevent excessive movement of the lower frame 4 relative to the upper frame 5 when a relatively large external horizontal force is applied to the seismic isolation bearing assembly.

The resistance-providing members 8 can be selected from springs, hydraulic cylinders, or pneumatic cylinders.

With the inclusion of the frame unit in the seismic isolation bearing assembly of this invention, the aforesaid drawbacks associated with the prior art can be eliminated.

With the invention thus explained, it is apparent that various modifications and variations can be made without departing from the spirit of the present invention.

We claim:

1. A seismic isolation bearing assembly comprising:
a frame unit including upper and lower frames that are spaced apart from each other, said upper frame being adapted to be secured to a machine body and defining a plurality of upper sub-frames, said lower frame being adapted to be secured to a foundation, on which the machine body is to be supported, and defining a plurality of lower sub-frames, each of which is aligned and cooperates with a respective one of said upper sub-frames to define a mounting cell therebetween; and a plurality of bearing units, each of which is mounted in said mounting cell defined by a respective one of said upper sub-frames and a respective one of said lower sub-frames, and each of which includes spaced apart upper and lower load plates and a bearing interposed between said upper and lower load plates, an upper bearing interposed between and in sliding contact with said upper and intermediate load plates, and a lower bearing interposed between and in sliding contact with said intermediate and lower load plates, said upper load plate being secured to the respective one of said upper sub-frames, said lower load plate being secured to the respective one of said lower sub-frames.

2. The seismic isolation bearing assembly of claim 1, wherein each of said upper and lower bearings of each of said bearing units is in the form of a cylindrical rod.

3. The seismic isolation bearing assembly of claim 2, wherein said upper bearings of said bearing units are disposed at the same level and are parallel to each other, said lower bearings of said bearing units being disposed at the same level, being parallel to each other, and being transverse to said upper bearings.

4. The seismic isolation bearing assembly of claim 3, wherein said upper load plate has an upper contact surface that faces toward said intermediate load plate, said intermediate load plate having a curved first intermediate contact surface that confronts said upper contact surface of said upper load plate, said upper bearing being disposed between and being in sliding contact with said upper contact surface of said upper load plate and said first intermediate contact surface of said intermediate load plate, said first intermediate contact surface of said intermediate load plate having two opposite ends that are opposite to each other in a first transverse direction relative to said cylindrical rod of said upper bearing, and extending curvedly in said first transverse direction to define an intermediate rest line of a lowest level in a middle position between said opposite end of said first intermediate contact surface so as to permit resting of said cylindrical rod of said upper bearing on said first intermediate contact surface of said intermediate load plate along said intermediate rest line by virtue of gravity.

5. The seismic isolation bearing assembly of claim 4, wherein said intermediate load plate further has a second intermediate contact surface that is opposite to said first intermediate contact surface, said lower load plate having a curved lower contact surface that faces toward said intermediate load plate, said lower bearing being disposed between and being in sliding contact with said second intermediate contact surface of said intermediate load plate and said lower contact surface of said lower load plate, said lower contact surface of said lower load plate having two opposite ends that are opposite to each other in a second transverse direction relative to said cylindrical rod of said lower bearing, and extending curvedly in said second transverse direction to define a lower rest line of a lowest level in a middle position between said opposite ends of said lower contact surface so as to permit resting of said cylindrical rod of said lower bearing on said lower contact surface of said lower load plate along said lower rest line by virtue of gravity.

6. The seismic isolation bearing assembly of claim 5, wherein said upper contact surface of said upper load plate extends curvedly in said first transverse direction, and has a shape that is inverse of that of said first intermediate contact surface of said intermediate load plate.

7. The seismic isolation bearing assembly of claim 6, wherein said second intermediate contact surface of said intermediate load plate extends curvedly in said second transverse direction, and has a shape that is inverse of that of said lower contact surface of said lower load plate.

8. The seismic isolation bearing assembly of claim 7, wherein each of said upper sub-frames has two opposite side portions that are opposite to each other in a first axial direction relative to said cylindrical rod of said upper bearing, said intermediate load plate being formed with two opposite side walls, each of which is aligned with and spaced apart from a respective one of said side portions of the respective one of said upper sub-frames by a distance that is less than the diameter of said cylindrical rod of said upper bearing so as to limit movement of said cylindrical rod of said upper bearing within said mounting cell.

9. The seismic isolation bearing assembly of claim 8, wherein each of said lower sub-frames has two opposite side portions that are opposite to each other in a second axial direction relative to said cylindrical rod of said lower bearing, each of said side walls of said intermediate load plate being aligned with and spaced apart from a respective one of said side portions of the respective one of said lower sub-frames by a distance that is less than the diameter of said cylindrical rod of said lower bearing so as to limit movement of said cylindrical rod of said lower bearing within said mounting cell.

* * * * *